US009989673B2

(12) United States Patent
Li et al.

(10) Patent No.: US 9,989,673 B2
(45) Date of Patent: Jun. 5, 2018

(54) PHOTONIC CRYSTAL MICROSPHERE

(71) Applicants: The Procter & Gamble Company, Cincinnati, OH (US); Institute of Chemistry, Chinese Academy of Sciences, Beijing (CN)

(72) Inventors: Mingzhu Li, Beijing (CN); Qiang Yang, Beijing (CN); Yanlin Song, Beijing (CN); Libin Wang, Beijing (CN); Liang Yang, Beijing (CN); Ping Wang, Beijing (CN)

(73) Assignees: The Procter & Gamble Company, Cincinnati, OH (US); Institute of Chemistry, Chinese Academy of Sciences, Beijing (CN)

( * ) Notice: Subject to any disclaimer, the term of this patent is extended or adjusted under 35 U.S.C. 154(b) by 0 days. days.

(21) Appl. No.: 15/053,443

(22) Filed: Feb. 25, 2016

(65) Prior Publication Data
US 2016/0170091 A1 Jun. 16, 2016

Related U.S. Application Data

(63) Continuation of application No. PCT/CN2014/085086, filed on Aug. 25, 2014.

(30) Foreign Application Priority Data

Aug. 27, 2013 (CN) .......................... 2013 1 0376405

(51) Int. Cl.
*G02B 1/00* (2006.01)
*G02B 1/04* (2006.01)
(Continued)

(52) U.S. Cl.
CPC ................ *G02B 1/005* (2013.01); *C08F 2/22* (2013.01); *C30B 5/00* (2013.01); *C30B 29/16* (2013.01);
(Continued)

(58) Field of Classification Search
CPC .... C08F 212/08; C08F 220/14; C08F 220/06; C08F 2/22; C08F 220/56; C08F 222/385; C30B 29/58
See application file for complete search history.

(56) References Cited

U.S. PATENT DOCUMENTS 6,337,131 B1 1/2002 Rupaner et al.
6,756,115 B2 6/2004 Fu et al.
6,818,051 B2 11/2004 Anselmann et al.

FOREIGN PATENT DOCUMENTS

CN 100420708 C 9/2008
JP 2005 107148 A 4/2005
(Continued)

OTHER PUBLICATIONS

Extended European Search Report dated Jun. 26, 2017, 8 pages.
(Continued)

Primary Examiner — Jianfeng Song
(74) Attorney, Agent, or Firm — Jeffrey V Bamber

(57) ABSTRACT

A photonic crystal microsphere, comprising: a plurality of mono-dispersed polymer particles in a closely-packed and regularly-ordered structure, with interstition therebetween, forming the photonic crystal microsphere; and a co-assembly material contained in the interstition. The photonic crystal microsphere provides a structure of enhanced strength and a good color effect.

11 Claims, 8 Drawing Sheets
(2 of 8 Drawing Sheet(s) Filed in Color)

(51) Int. Cl.
*C08F 2/22* (2006.01)
*C30B 29/58* (2006.01)
*C30B 5/00* (2006.01)
*C30B 29/16* (2006.01)
*C30B 29/46* (2006.01)
*C30B 29/60* (2006.01)
*C08F 220/56* (2006.01)
*C08F 222/38* (2006.01)

(52) U.S. Cl.
CPC .............. *C30B 29/46* (2013.01); *C30B 29/58* (2013.01); *C30B 29/60* (2013.01); *G02B 1/04* (2013.01); *C08F 220/56* (2013.01); *C08F 222/385* (2013.01)

(56) References Cited

FOREIGN PATENT DOCUMENTS

| | | | |
|---|---|---|---|
| JP | 2008 298959 A | 12/2008 | |
| WO | WO 01/96635 A2 | 12/2001 | |
| WO | WO 02/44301 A2 | 6/2002 | |
| WO | WO-0244301 A2 * | 6/2002 | ............... C09C 1/00 |

OTHER PUBLICATIONS

Yamasaki Takashi et al, "Spontaneous emission from fluorescent molecules embedded in photonic crystals consisting of polystyrene microspheres", Applied Physics Letters, A I P Publishing LLC, US, vol. 72, No. 16, Apr. 20, 1998, pp. 1957-1059, XP-012020016, ISSN: 0003-6951, DOI: 10.1063/1.121234.

* cited by examiner

PHOTONIC CRYSTAL MICROSPHERE

FIELD OF THE INVENTION

The present invention relates to a photonic crystal microsphere comprising a plurality of mono-dispersed particles and a co-assembly material. The present invention also relates to a method of making the photonic crystal microsphere, and a photonic crystal pigment comprising the photonic crystal microsphere.

BACKGROUND OF THE INVENTION

Photonic crystal microspheres built up by mono-dispersed particles have been known to yield color effects as a result of the periodic arrangement of the mono-dispersed particles therein. Specifically, a plurality of mono-dispersed particles is assembled in a closely-packed and regularly-ordered structure to form one photonic crystal microsphere. This highly organized structure, with the size of the mono-dispersed particles in the range of wavelength of visible light, selectively diffracts certain wavelengths and therefore renders a color corresponding to the diffracted wavelengths. The color effects can be optimized by adjusting the refractive index in the structure, changing materials or particle sizes of the mono-dispersed particles, etc.

It is also known to use the photonic crystal microsphere with color effects as a color pigment for preparing various products, e.g., paint, ink, plastic. However, such usage as a color pigment, poses challenges to the photonic crystal microspheres, particularly to the strength of the structure thereof. Without attaining a certain level of mechanical strength, the periodic structure formed by the mono-dispersed particles can be easily damaged (e.g., fall apart), particularly when subjected to a force, for example, in a typical mixing process. With structure damage, the photonic crystal microsphere cannot reliably deliver a desirable color effect.

One reported approach to increase mechanical strength includes the addition of secondary, smaller particles into the spaces between the mono-dispersed particles as a binding agent to hold the microsphere structure together. However, this approach fails to sufficiently consider the ability of these secondary, smaller particles to effectively disperse within the spaces (i.e., minimizing voids). Poor dispersion of the secondary, smaller particles may not significantly improve structure strength, and even in some cases worsen the structure strength.

Thus, there is a need for a photonic crystal microsphere that has a structure of enhanced strength and that maintains a desired color effect (e.g., keeping predetermined color fidelity).

It is an advantage of the present invention to provide a photonic crystal microsphere that enables a pure color (i.e., within a defined wavelength) across the full visible spectrum, without angle-dependency.

It is yet another advantage of the present invention to provide an efficient large scale production method of making a photonic crystal microspheres and/or photonic crystal pigments and/or photonic crystal pigments containing the same.

It is even yet another advantage of the present invention to provide a photonic crystal pigment with improved mechanical strength to various products that otherwise may not be able to because of the mechanical stresses typically associated with the manufacturing processes of the products.

SUMMARY OF THE INVENTION

The present invention is directed to a photonic crystal microsphere comprising:

a) a plurality of mono-dispersed polymer particles each having a particle size of 100 nm to 1500 nm in a closely-packed and regularly-ordered structure with interstition therebetween, forming the photonic crystal microsphere having a particle size of 1 μm to 1000 μm; and b) a co-assembly material contained in the interstition.

In another aspect, the present invention is directed to a method of making the aforementioned photonic crystal microsphere, comprising:

a) preparing a liquid solution comprising: a liquid medium, and the co-assembly material or a co-assembly material precursor;

b) dispersing the plurality of mono-dispersed polymer particles into the liquid solution to form a dispersion; and c) removing the liquid medium from the dispersion, preferably by spray drying, microfluidic method, or inkjet printing, thereby forming the photonic crystal microsphere.

In yet another aspect, the present invention is directed to a photonic crystal pigment comprising one or more of the aforementioned photonic crystal microspheres.

In even yet another aspect, the present invention is directed to the use of the aforementioned photonic crystal pigment as a color pigment for preparing a product selected from paint, ink, dye, plastic product, rubber product, ceramic, cosmetic, labeling, packaging, or the like.

BRIEF DESCRIPTION OF THE DRAWINGS

The patent or application file contains at least one photograph executed in color. Copies of this patent or patent application publication with color photographs will be provided by the Office upon request and payment of the necessary fee.

DETAILED DESCRIPTION OF THE INVENTION

Figure 1:
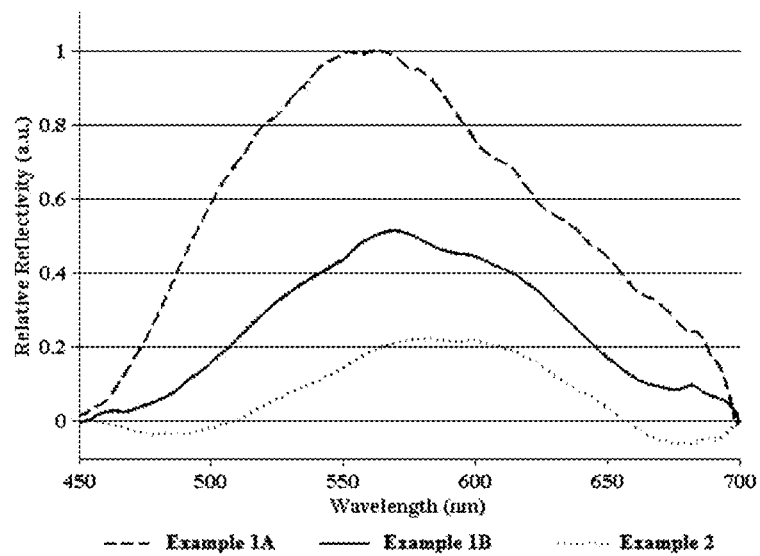
FIG. 1 illustrates the spectra of the photonic crystal microspheres of Examples 1A, 1B, and 2.

In the present invention, it has been surprisingly found that, by selecting a particular type of mono-dispersed particle (namely mono-dispersed polymer particles), in combination with a co-assembly material added into interstition between the particles, the assembled photonic crystal microsphere provides enhanced structure strength, as well as a desired, lasting color effect (e.g., maintaining predetermined color fidelity). Without wishing to be bound by theory, it is believed that due to their relatively elastic nature (compared to mono-dispersed inorganic particles such as silica), the mono-dispersed polymer particles used in the present invention enable a more closely-packed assembly and therefore form a photonic crystal microsphere with a stronger structure. Moreover, the addition of co-assembly material into the interstition further strengthens the structure. Without wishing to be bound by theory, the co-assembly material is believed to provide a chemical network for holding the closely-packed mono-dispersed polymer particles together, thereby improving the strength of the structure. The strengthened structure further maintains a desired color effect, even after being subjected to mechanical stress.

Moreover, the photonic crystal microsphere herein may enable a pure color across the full visible spectrum, without angle-dependency. "Pure color" is defined as color resulting from photons with a specific range of wavelength, rather than a secondary color composed by three or more fundamental colors. Specifically, the color effects of the photonic crystal microsphere (as well as a photonic crystal pigment comprising a plurality of the photonic crystal microspheres) are precisely controlled by: i) adjusting the particle size of the mono-dispersed polymer particles therein; ii) changing the materials of the mono-dispersed polymer particles and the co-assembly material (thereby modulating the difference in refractive index between the two); iii) and/or selecting a particular type of preparation method. Without wishing to be bound by theory, some of the co-assembly material of the present invention may occupy the interstition so as to minimize voids. Accordingly, there may be benefits to the strength of the structure and/or color fidelity.

Definitions

As used herein, the term "photonic crystal microsphere" herein refers to a microsphere generated by the periodic assembly of mono-dispersed particles, demonstrating a visible color attributable to light diffraction caused by its period structure. The term "mono-dispersed particles" herein refers to particles of a relatively uniform size, which form a periodic structure that selectively diffracts visible light of certain wavelengths and that therefore renders the photonic crystal microsphere a visible color corresponding to the diffracted wavelengths. The mono-dispersed particles, as used herein, are made of polymers, namely mono-dispersed polymer particles (in contrast to mono-dispersed inorganic particles such as silica). In the photonic crystal microsphere, the mono-dispersed particles are closely-packed and regularly-ordered, i.e., the particles are arranged in contact with one another to form the microsphere. Such a photonic crystal microsphere with closely-packed and regularly-ordered mono-dispersed particles is generally described in U.S. Pat. No. 6,818,051 B2, esp. column 2, line 6 et seq. Furthermore, inevitably there are spaces between the mono-dispersed particles of the photonic crystal microsphere (since the particles are generally spherical), wherein the spaces are referred to as "interstition" in the present invention.

As used herein, the term "co-assembly material" herein refers to material contained in the interstition, i.e., occupying the interstition partially or completely, but preferably completely, so as to form a photonic crystal microsphere with a more uniform structure. The term "completely occupy the interstition" herein means that in terms of volume, the co-assembly material occupies at least 90%, alternatively at least 95%, alternatively at least 98%, alternatively at least 99%, of the interstition in the photonic crystal microsphere. Air, etc., may occupy the remaining percentage of the interstition (as a void). During an assembly process (i.e., the process of assembling the photonic crystal microsphere), the co-assembly material can be added either as it is or as a co-assembly material precursor. The term "co-assembly material precursor" herein refers to an ingredient, or a combination of ingredients, that are capable of reacting to form the co-assembly material (as found in the final photonic crystal microsphere). For example, the co-assembly material precursor corresponding to a co-assembly material of synthetic polymer typically comprises a monomer, an initiator, and a cross-linking agent.

As used herein, the term "polydispersity index (PDI)" is a parameter characterizing the distribution width of the particle sizes of the mono-dispersed particles. In the present invention, the PDI is tested according to method ISO 13321: 1996E (1996) "Particle Size Analysis—Photon Correlation Spectroscopy". As the value decreases, the particles have more narrowly distributed particle sizes.

As used herein, the term "photonic crystal pigment" refers to a color pigment comprising the photonic crystal microspheres, which imparts color to other materials such as paint or ink or plastic. The color pigment is typically in a powder form.

As used herein, the articles including "a" and "an" when used in a claim, are understood to mean one or more of what is claimed or described.

As used herein, the terms "comprise", "comprises", "comprising", "include", "includes", "including", "contain", "contains", and "containing" are meant to be non-limiting, i.e., other steps and other ingredients which do not affect the end of result can be added. The above terms encompass the terms "consisting of" and "consisting essentially of".

Photonic Crystal Microsphere

The photonic crystal microsphere of the present invention comprises a plurality of mono-dispersed polymer particles in a closely-packed and regularly-ordered structure, with interstition therebetween, forming the photonic crystal microsphere; and a co-assembly material contained in the interstition. The mono-dispersed polymer particles each have a particle size of 100 nm to 1500 nm, preferably of 150 nm to 1000 nm, more preferably of 180 nm to 400 nm. The photonic crystal microsphere has a particle size of 1 µm to 1000 preferably of 1 µm to 500 more preferably of 1 µm to 300 Relative standard deviation of micro sphere size is 5%-50%. This characterization is used widely in the academic literature. See e.g., Royston Goodacre, *The optimization of facile substrates for surface enhanced Raman scattering through galvanic replacement of silver onto copper*, The Royal Society of Chemistry 2012, volume 137, page 2794. Being assembled by a plurality of the mono-dispersed polymer particles, a photonic crystal microsphere is generally larger in size than the mono-dispersed polymer particles forming this photonic crystal microsphere.

The mono-dispersed polymer particles herein have a relatively low PDI, preferably a PDI of below 0.2, more preferably a PDI of below 0.1, even more preferably a PDI of below 0.05, yet even more preferably a PDI of below 0.02, alternatively at a PDI of at least 0.001. In one embodiment, the mono-dispersed polymer particles have a particle size of 150 nm to 1000 nm with a PDI of below 0.1, preferably of 180 nm to 400 nm with a PDI from below 0.05 to 0.001. Preferably, the assembled photonic crystal microsphere is isotropic, i.e., the microsphere provides an angle-independent color (i.e., demonstrating a consistent color when viewing from different angles). This is because the optical stop band of the mono-dispersed polymer particles is independent of the rotation under illumination of an incident light. By contrast, their conventional film or plate photonic crystal counterparts are angle-dependent. It is further worth mentioning that in the case that a plurality of photonic crystal microspheres is used as a pigment (that is described below), the plurality of photonic crystal microspheres do not have to collectively achieve a low PDI. That is to say, the plurality of photonic crystal microspheres can be of various particle sizes as the particle sizes thereof do not impact the color effect.

Preferably in the photonic crystal microsphere described herein, the co-assembly material is a different material from the mono-dispersed polymer particles. The term "different materials" herein refers to materials that differ in at least one chemical element. Different materials have different refractive indices, and the difference in refractive index between the mono-dispersed polymer particles and the co-assembly material critically influences the color effect of the photonic crystal microsphere. Therefore, preference is given to a pairing of the mono-dispersed polymer particles and the co-assembly material so as to maintain a desired difference in refractive index. In one embodiment, the color effects according to the invention are observed with differences in refractive index in the range from about 0.01 to 4, alternatively from 0.05 to 2, alternatively from 0.1 to 1.

In addition to different refractive indices, the mono-dispersed polymer particles and the co-assembly material of the present invention are also preferably selected based on certain general industrial criteria, such as non-repulsion and non-dissolution criteria. This is understandable as mono-dispersed particles and co-assembly material that are repulsive or dissoluble to each other are relatively difficult to co-assemble.

Mono-Dispersed Polymer Particles

The mono-dispersed polymer particles of the present invention assemble in a closely-packed and regularly-ordered structure to form the photonic crystal microsphere. The mono-dispersed polymer particles can be selected from any suitable mono-dispersed polymer particles known in the art. Preferably, the mono-dispersed polymer particle is selected from the group consisting of polyacrylic acid, polyacrylate, polystyrene, polyacrylamide, polyethylene, polypropylene, polylactic acid, polyacrylonitrile, derivatives thereof, salts thereof, and combinations thereof. More preferably, the mono-dispersed polymer particle is selected from the group consisting of polymethyl methacrylate, polyethyl metharylate, poly(n-butyl methacrylate), polystyrene, poly(chloro-styrene), poly(alpha-methyl-styrene), poly(N-methylolacrylamide), polystyrene-methyl methacrylate, polyalkylated acrylate, polyhydroxyl acrylate, polyamino acrylate, polycyanoacrylate, poly fluorinated acrylate, polyacrylic acid, polymethylacrylic acid, poly(methyl methacrylate-ethyl acrylate-acrylic acid), poly(styrene-methyl methacrylate-acrylic acid), derivatives thereof, salts thereof, and combinations thereof.

In one embodiment, the mono-dispersed polymer particle is of a core-shell structure, with an internal core selected from polystyrene or derivatives thereof, and an outer shell selected from the group consisting of polymethyl methacrylate, polyacrylic acid, and combinations thereof. Such a core-shell structure is described in Youzhuan Zhang et al., Section 2.1, *Fabrication of Functional Colloidal Photonic Crystals based on Well-designed Latex Particles*, Journal of Materials Chemistry, May 2011. The structure is also described in Chinese Patent No. 100420708C. In the core-shell structure, the relatively hard core (e.g., polystyrene) keeps a well-ordered arrangement of the mono-dispersed polymer particles, and the relatively elastic shell (e.g., poly(methyl methacrylate-co-acrylic acid)) enables a more closely-packed assembly, both contributing to improved mechanical strength of the structure.

The mono-dispersed polymer particles can be made by any suitable methods known in the art, including but not limited to: emulsion polymerization (with or without an emulsifier), emulsifier-free emulsion polymerization, dispersion polymerization, solution polymerization, and suspension polymerization. Generally, the mono-dispersed polymer particles are made by polymerizing relevant monomers (and optional initiators and optional emulsifiers) in an aqueous solution to obtain a dispersion comprising the mono-dispersed polymer particles.

Co-Assembly Material

The co-assembly material of the present invention is contained in the interstition between the mono-dispersed polymer particles of the photonic crystal microsphere. The co-assembly material can be selected from any suitable materials, preferably different from the mono-dispersed polymer particles. In one embodiment, the co-assembly material is selected from the group consisting of a polymer, a nanocrystalline particle, and a combination thereof. Preferably, the co-assembly material is a polymer, more preferably a synthetic polymer. Without wishing to be bound by theory, it is believed that compared to inorganic co-assembly materials (e.g., nanocrystalline particles), a polymer co-assembly material provides a stronger network for holding the closely-packed mono-dispersed polymer particles and therefore enables a stronger structure of the photonic crystal microsphere. Moreover, the polymer co-assembly material allows ease and efficiency of recycling or may improve the recyclability of the assembled photonic crystal microsphere (compared to inorganic co-assembly materials).

In one preferred embodiment, the co-assembly material is a synthetic polymer selected from the group consisting of polyacrylic acid, polyacrylate, polyacrylamide, polyvinyl alcohol, polyvinyl acetate, polyethylene glycol, polypropylene glycol, polyol, polyester, polyurethane, polyurea, polymaleic acid, polyfumaric acid, polyitaconic, derivatives thereof, salts thereof, and combinations thereof. Preferably, the synthetic polymer is selected from the group consisting of polyacrylic acid, polymethyl acrylic acid, polyacrylamide, poly(N-isopropylacrylamide), poly(N-methylolacrylamide), poly(N-methyl isopropyl acrylamide), polymethyl acrylate, polyethyl acrylate, poly(n-butyl acrylate), polymethyl methacrylate, polyethyl methacrylate, poly(n-butyl methacrylate), and a combination thereof.

In an alternative embodiment, the co-assembly material is a nanocrystalline particle with a particle size of 0.01 nm to 30 nm (consistent with manufacturer's specifications). Preferably, the nanocrystalline particle is selected from the group consisting of a nanocrystalline silica particle, a nanocrystalline titanium dioxide particle, a nanocrystalline zirconia particle, a nanocrystalline alumina particle, a nanocrystalline zinc oxide particle, a nanocrystalline zinc sulfide particle, a cadmium sulfide quantum dot, a cadmium selenide quantum dot, a cadmium telluride quantum dot, a nanocrystalline silver particle, a nanocrystalline gold particle, and a combination thereof. More preferably, the nanocrystalline particle is a nanocrystalline silica particle with a particle size of 0.01 nm to 30 nm, alternatively 1 nm to 28 nm, alternatively 10 nm to 25 nm.

In a highly preferred embodiment, the photonic crystal microsphere of the present invention comprises:

a) a plurality of the mono-dispersed polymer particles each having a particle size of about 150 nm to 400 nm with a PDI from below 0.05 to 0.001 in a closely-packed and regularly-ordered structure, with interstition therebetween, forming the photonic crystal microsphere having a particle size of about 1 μm to 300 μm, wherein the mono-dispersed particles each comprise a polymer selected from the group consisting of polymethyl methacrylate, polyethyl metharylate, poly(n-butyl methacrylate), polystyrene, poly(chloro-styrene), poly(alpha-methyl-styrene), polystyrene-methyl methacrylate, polyalkylated acrylate, polyhydroxyl acrylate, polyamino acrylate, polycyanoacrylate, poly fluorinated acrylate, polyacrylic acid, polymethylacrylic acid, poly(methyl methacrylate-ethyl acrylate-acrylic acid), poly(styrene-methyl methacrylate-acrylic acid), polyactide (PLA) derivatives thereof, salts thereof, and combinations thereof; and b) the co-assembly material contained in the interstition, wherein the co-assembly material is a synthetic polymer selected from the group consisting of polyacrylic acid, polymethyl acrylic acid, polyacrylamide, poly(N-isopropylacrylamide), poly(N-methylolacrylamide), poly(N-methyl isopropyl acrylamide), polymethyl acrylate, polyethyl acrylate, poly(n-butyl acrylate), polymethyl methacrylate, polyethyl methacrylate, poly(n-butyl methacrylate), and a combination thereof, wherein the co-assembly material is a different material from the mono-dispersed polymer particles.

Preparation Method

The photonic crystal microsphere of the present invention is generally prepared by conventional methods such as those known in the art directed to assembling photonic crystal microspheres. Such methods typically involve mixing the essential and optional ingredients in any desired order in a liquid medium to a relatively uniform state, with or without heating, cooling, and the like, then removing the liquid medium by any suitable method, thereby providing a photonic crystal microsphere assembled by mono-dispersed particles. One possible way is described in U.S. Pat. No. 6,756,115.

In one embodiment, the present invention is directed to a method of making the photonic crystal microspheres herein, comprising:

a) preparing a liquid solution comprising: a liquid medium, and the aforementioned co-assembly material or a co-assembly material precursor, wherein preferably the liquid medium is water. Suitable ranges of co-assembly material in the liquid solution is from 0.01% to 40%, preferably from 0.1% to 20%, more preferably from 1% to 10% by weight of the liquid medium;

b) dispersing the plurality of mono-dispersed polymer particles into the liquid solution to form a dispersion, preferably the mono-dispersed polymer particles are present from 0.1% to 80%, alternatively from 1% to 80%, preferably from 1% to 50%, more preferably from 5% to 30%, even more preferably from 8% to 20%, by weight of the dispersion; and c) removing the liquid medium from the dispersion, thereby forming the photonic crystal microsphere.

The mono-dispersed polymer particles are assembled in a closely-packed and regularly-ordered structure through step c). That is to say, the formed photonic crystal microsphere is of a stable, periodic structure and therefore does not need a subsequent step to fix the structure. Nevertheless, alternatively the photonic crystal microsphere obtained in step c) can experience a subsequent curing step to further fix the periodic structure. Moreover, the mono-dispersed polymer particles herein preferably are self-assembled to form the 3-dimensional photonic crystal microsphere, without having to deposit onto any substrate (e.g., glass, rubber, plastic). Thus, the present process also eliminates the need for using a substrate, as well as detaching the formed photonic crystal particles from the substrate.

The mono-dispersed polymer particles herein can be assembled through any micro-droplet assembly method. In one embodiment, in step c) the liquid medium is removed from the dispersion preferably by a method selected from spray drying, microfluidic method, inkjet printing, electrospinning, and the like. More preferably, the liquid medium is removed by spray drying. In the present invention, it has been surprisingly found that spray drying is particularly useful as an efficient mass production method of assembling the mono-dispersed polymer particles and the co-assembly material. In one embodiment, the liquid medium is removed from the dispersion by spray drying with a carrier gas selected from air, a noble gas (e.g., argon), or nitrogen, and with inlet temperature set to be from 20° C. to 500° C. The carrier gas is preferably nitrogen, and the inlet temperature is preferably set to be from 100° C. to 250° C., more preferably from 150° C. to 250° C., more preferably from 180° C. to 220° C. The pressure can be from 0.30 MPa to 0.50 MPa, alternatively from 0.36 MPa to 0.42 MPa, alternatively about 0.38 MPa. The nozzle velocity can be from 500 to 3,000 ml per hour, alternatively from 1000 ml/hr to 2000 ml/hr, alternatively about 1760 ml/hr.

In step a) the liquid solution can comprise either the co-assembly material or a co-assembly material precursor. In the nanocrystalline particle execution, the co-assembly material is preferably added into the liquid solution as it is. Preferably, the co-assembly material is a nanocrystalline particle with a particle size of 0.01 nm to 30 nm, alternatively 1 nm to 28 nm, alternatively 10 nm to 25 nm. Preferably, in the dispersion (comprising the plurality of mono-dispersed polymer particles and the liquid solution), the volume ratio of the mono-dispersed particles to the nanocrystalline particle is from 5:1 to 2:1, preferably from 4.5:1 to 2.5:1, respectively. In the execution where the co-assembly material is a polymer, the co-assembly material can be added as it is or in its precursor form (namely, as a co-assembly material precursor), but preferably added as a co-assembly material precursor. In the execution of co-assembly material precursor, the dispersion is preferably exposed to certain conditions, e.g., a specific temperature or ultraviolet irradiation, thereby enhancing the formation of the co-assembly material from its precursor form, as well as the co-assembly of the mono-dispersed polymer particles and the co-assembly material.

In one embodiment, the co-assembly material precursor comprises a monomer, an initiator, and a cross-linking agent. Preferably, in the liquid solution (comprising the co-assembly material precursor and a liquid medium), the weight ratios of the initiator to the monomer and of the cross-linking agent to the monomer are each from 1:100 to 1:1, preferably from 1:100 to 1:5, more preferably from 1:50 to 1:10, more preferably from 1:20 to 1:10, respectively. Preferably, in the dispersion (comprising the plurality of mono-dispersed polymer particles and the liquid solution), the volume ratio of the mono-dispersed polymer particles to the monomer is from 5:1 to 2:1, preferably from 4.5:1 to 2.5:1, respectively.

In the co-assembly material precursor, the monomer, the initiator, and the cross-linking agent can be any of those suitable for use herein, depending on the predetermined polymer type for the co-assembly material.

In one embodiment, the monomer is selected from the group consisting of acrylic acid, acrylate, acrylamide, vinyl alcohol, vinyl acetate, ethylene oxide, derivatives thereof, salts thereof, and combinations thereof. Preferably the monomer is selected from the group consisting of acrylic acid, methyl acrylic acid, acrylamide, N-isopropylacrylamide, N-methylolacrylamide, N-methyl isopropyl acrylamide, methyl acrylate, ethyl acrylate, n-butyl acrylate, methyl methacrylate, ethyl methacrylate, n-butyl methacrylate, and a combination thereof.

The initiator can be a thermal initiator or a photoinitiator, or the like. The thermal initiator is preferably selected from the group consisting of a persulfate, peroxide, azo compound, and a combination thereof. More preferably, the thermal initiator is selected from the group consisting of ammonium persulfate, potassium persulfate, hydrogen peroxide, azobis(isobutylamidine hydrochloride), azobis(isopropyl imidazoline hydrochloride), and a combination thereof. The photoinitiator is preferably selected from the group consisting of benzoin, benzyl, alkyl ketone, acyl phosphine oxide, bi-benzophenone, and a combination thereof. More preferably, the photoinitiator is selected from the group consisting of 2-hydroxyl-2-methyl-1-phenyl-1-acetone, diethoxyhexanophenone, 2,4,6-trimethylbenzoyl phenylphosphinate, 1-hydroxycyclohexyl phenyl ketone, and a combination thereof.

The cross-linking agent is preferably selected from the group consisting of aziridine cross-linking agent, polyimide cross-linking agent, polyisocyanate cross-linking agent, epoxy resin cross-linking agent, metallic ion cross-linking agent or a combination thereof. More preferably, the cross-linking agent is selected from the group consisting of N,N-methylenebisacrylamide, ethyleneglycol dimethacrylate, epoxy silane, polycarbodiimide, a metallic ion cross-linking agent is a $NH_3$ coordinated metallic ion cross-linking agent with a metallic ion selected from $Mg^{2+}$, $Al^{3+}$, $Zn^{2+}$, $Ca^{2+}$, or $Cu^{2+}$, and a combination thereof. Potential suppliers can include DuPont or BASF.

Photonic Crystal Pigment

In another aspect, the present invention is directed to photonic crystal pigment, comprising one or more of the aforementioned photonic crystal microspheres. As discussed above, the photonic crystal microspheres in the photonic crystal pigment do not have to achieve a low PDI.

In yet another aspect, the present invention is directed to the use of the photonic crystal pigment as a color pigment, for preparing a product selected from paint, ink, dye, plastic product, rubber product, ceramic, or cosmetic. Non-limiting examples of a cosmetic include: hair dye, hair colorant, nail polish, eye mascara, eye liner, eyebrow pencil, lip stick and the like. When used in the product, the photonic crystal pigment herein can either replace conventional color pigments or be combined with the conventional color pigments. In the present invention, because of the improved mechanical strength, the photonic crystal pigment can be applied to a broader range of products (that otherwise would not be applied to because of the mechanical stresses typically associated with the manufacturing processes of the products). For example, the manufacturing process of a paint typically involves a high-shear mixing step, which could easily damage the structure of a photonic crystal pigment with low structure strength.

In terms of process, the photonic crystal pigment can be added into the final product, or alternatively added in one preparation step (of multiple steps) for making the product. In both scenarios, the photonic crystal pigment can be added either directly or via a carrier (e.g., a solvent). When added in the preparation step for making a product, the photonic crystal pigment typically is mixed with certain other ingredients (that may also be contained in the final product). For example, when used to make a paint, the photonic crystal pigment is mixed with acrylic lacquer in an ethanol solution to form the paint. In another example, the photonic pigment is mixed with nitrocellulose in a solution that comprises acetone, ethyl acetate, ethyl lactate, phthalic acid, or ethanol, or combinations thereof (in an appropriated proportion), to make a nail polish. In yet another example, three types of photonic crystal pigments that demonstrate cyan, magenta, and yellow colors respectively are mixed with diethylene glycol, propylene glycol, and deionized water, to form three inks with the pigment primary colors (namely, cyan, magenta, and yellow) separately. Thereafter, these three inks can be mixed in any appropriate proportions to obtain any color across the full visible spectrum. Such inks with the pigment primary colors have broad applications, such as in a printer. See e.g., Sunghoon Kwon, *Structural color printing using a magnetically tunable and lithographically fixable photonic crystal*, Nature Photonics, Aug. 2009.

Test Method

Rub Test

Mechanical property of photonic crystal pigments under abrasion are tested by RUB TESTER SUTHERLAND 2000 with 3M film (JC-1100-7476-5) according to ASTM D5264-92, under the weight of 2 kg. The ASTM method is modified in that the tested cycle is 5 times at 106 cycle/min.

Spectrum

Color spectrum of photonic crystal microspheres can be obtained via a spectrophotometer. A Shanghai Ideaoptics PG 2000 UV-Vis spectrophotometer is used herein. The instrument is calibrated by a spectrum obtained by illustration on a white board as bright field, namely 100% reflection, while the spectrum obtained without light source is as a dark field, namely 0% reflection.

Structure

The structure of photonic crystal microspheres can be observed via Scanning Electron Microscope (SEM) by scanning of the cross-section view of the photonic crystal microsphere microscopically. A HITACHI S-7500 SEM system is used herein. SEM viewing sample is prepared by placing a powder form of the photonic crystal microsphere on a conductive adhesive. The viewing sample is photographed after depositing a film of platinum several nanometers thick thereto.

EXAMPLE

The Examples herein are meant to exemplify the present invention but are not used to limit or otherwise define the scope of the present invention. Examples 1A-1D are examples according to the present inventions. Example 2 is a comparative example.

Examples 1-2

Photonic Crystal Microspheres

The following photonic crystal microspheres shown in Table 1 are each assembled by the mono-dispersed particles and the co-assembly material. Specifically, the mono-dispersed particles are assembled in a closely-packed and regularly-ordered structure, with interstition therebetween, forming the photonic crystal microsphere. The co-assembly material is contained in the interstition. Table 1 also indicates the color shown by each photonic crystal microsphere.

polymerization is used to obtain mono-dispersed core-shell particles as described in examples 1-3 of Chinese Patent No. 100420708C. In the present invention, a mixture is obtained by dispersing 9.5 g of styrene, 0.5 g of methyl methacrylate, and 0.5 g of acrylic acid in 50 mL of water, in the presence of 0.0055 g of sodium dodecyl benzene sulfonate as an emulsifier, and adding 0.25 g of ammonium bicarbonate as a buffer. The temperature of the mixture is maintained at 70° C. for 30 minutes, and then 0.2 g of ammonium peroxodisulfate is added as an initiator. The polymerization is carried out at 80° C. for 10 hours, with a continuous stirring, thereby obtaining an emulsion comprising a plurality of the mono-dispersed PS(core)/PMMA-PAA(shell) particles having a particle size of 215 nm with a PDI of below 0.05;

b) separately preparing a liquid solution comprising acrylamide (as a monomer), ammonium persulfate (as a thermal initiator), N,N-methylenebisacrylamide (as a cross-linking agent), and the balance is water;

c) dispersing the emulsion (having 87 wt % water) comprising the mono-dispersed PS(core)/PMMA-PAA (shell) particles obtained in step a) into the liquid solution obtained in step b) to form a dispersion. The dispersion comprises 10% of the mono-dispersed PS particles, 2.5% of the acrylamide, 0.25% of the ammonium persulfate, and 0.25% of the N,N-methylenebisacrylamide, by weight of the dispersion; and d) filling the dispersion obtained in step c) in spray dryer type YC-015 from Shanghai Pilotech Instrument & Equipment Co., Ltd, and spray drying the dispersion with a carrier gas of nitrogen and inlet temperature of 200° C., at 0.38 MPa, thereby forming the photonic crystal microsphere of Example 1A.

TABLE 1

|  | Mono-dispersed Particles | | | |
| --- | --- | --- | --- | --- |
|  | Material | Particle size average | Co-assembly Material | Color |
| 1A | Core of Polystyrene ("PS") and shell of poly(methyl methacrylate-co-acrylic acid) ("PMMA-PAA") | 215 nm with a PDI of below 0.05 | Polyacrylamide | Green |
| 1B | Core of PS and shell of PMMA-PAA | 215 nm with a PDI of below 0.05 | Nanocrystalline $TiO_2$ particles with a particle size of 18-22 nm | Green |
| 1C | PS | 284 nm with a PDI of below 0.05 | Polyacrylamide | Red |
| 1D | PS | 253 nm with a PDI of below 0.05 | Nanocrystalline $TiO_2$ particles with a particle size of 18-22 nm | Orange |
| Comparative 2 | Silica | 250 nm with a PDI of below 0.05 | Nanocrystalline $TiO_2$ particles with a particle size of 18-22 nm | Green |

PS monomer: styrene, Grade: Analytically pure, Supplier A.R. Beijing Chemical Works.
PMMA monomer: methyl methacrylate. Grade: Analytically pure, Supplier: A.R. Beijing Chemical Works.
PAA monomer: acrylic acid, Grade: Analytically pure, Supplier: A.R. Beijing Chemical Works.
Co-assembly materials, PAM monomer: Acrylamide, Grade VetecTM reagent, Supplir Sigma-Aldrich.
Initiator APS: ammonium peroxodisulfate, Grade: reagent 98%, Supplier: Sigma-Aldrich, grade 98%, Sigma Aldrich).
Emulsifier SDBS: sodium dodecyl benzene sulfonate. Grade: soft type, mixture, 95%(T), Supplier: J&K.
Buffer $NH_4HCO3$: ammonium bicarbonate, Grade: Reagent Plus ® >=99%, supplier: Sigma-Aldrich.
Cross link additive: N,N'-Methylenebis(acrylamide) Grade: 99%, Supplier: Sigma-Aldrich.

Processes for Making the Photonic Crystal Microspheres of Examples 1A-1D

The photonic crystal microsphere of Example 1A is manufactured by the following steps:

a) preparing mono-dispersed PS(core)/PMMA-PAA (shell) particles having a particle size of 215 nm with a PDI of below 0.05 via emulsion polymerization. Emulsion The photonic crystal microsphere of Example 1B is manufactured by the following steps:

a) repeat step a) as in Example 1A to obtain an emulsion comprising a plurality of mono-dispersed PS(core)/PMMA-PAA(shell) particles having a particle size of 215 nm with a PDI of below 0.05;

b) separately preparing a liquid solution comprising nanocrystalline $TiO_2$ particles with a particle size of 18-22 nm and balance water. The nanocrystalline $TiO_2$ particles are type P25 commercially available from Evonik Degussa;

c) dispersing the emulsion (having 80.4 wt % water) comprising the mono-dispersed PS(core)/PMMA-PAA (shell) particles obtained in step a) into the liquid solution obtained in step b) to form a dispersion. The dispersion comprises 10% of the mono-dispersed particles and 9.6% of the nanocrystalline $TiO_2$ particles, by weight of the dispersion; and d) filling the dispersion obtained in step c) in spray dryer type YC-015 from Shanghai Pilotech Instrument & Equipment Co., Ltd, and spray drying the dispersion with a carrier gas of nitrogen and inlet temperature of 200° C., at 0.38 MPa, thereby forming the photonic crystal microsphere of Example 1B.

The photonic crystal microsphere of Example 1C is manufactured by the following steps:

a) preparing mono-dispersed PS particles having a particle size of 285 nm with a PDI of below 0.05 via emulsion polymerization. Firstly dispersing 9.5 g of styrene in 50 mL of water, in the presence of 0.0045 g of sodium dodecyl benzene sulfonate as an emulsifier and 0.25 g of ammonium bicarbonate as a buffer, thereby obtaining a mixture. The temperature of the mixture is maintained at 70° C. for 30 minutes, and then 0.2 g of ammonium peroxodisulfate is added as an initiator. The polymerization is carried out at 80° C. for 10 hours, with continuous stirring, thereby obtaining an emulsion comprising a plurality of the mono-dispersed PS particles having a particle size of 285 nm with a PDI of below 0.05; and b) repeat steps b), c), and d) as in Example 1A except for that the mono-dispersed particles therein are mono-dispersed PS particles having a particle size of 285 nm with a PDI of below 0.05.

The photonic crystal microsphere of Example 1D is manufactured by the following steps:

a) preparing mono-dispersed PS particles having a particle size of 253 nm with a PDI of below 0.05 via emulsion polymerization. Firstly dispersing 9.5 g of styrene in 50 mL of water, in the presence of 0.0050 g of sodium dodecyl benzene sulfonate as an emulsifier and 0.25 g of ammonium bicarbonate as a buffer, thereby obtaining a mixture. The temperature of the mixture is maintained at 70° C. for 30 minutes, and then 0.2 g of ammonium peroxodisulfate is added as an initiator. The polymerization is carried out at 80° C. for 10 hours, with continuous stirring, thereby obtaining an emulsion comprising a plurality of the mono-dispersed PS particles having a particle size of 253 nm with a PDI of below 0.05; and b) repeat steps b), c), and d) as in Example 1B except for that the mono-dispersed particles therein are PS particles.

Processes for Making the Photonic Crystal Microsphere of Comparative Example 2

The photonic crystal microsphere of Comparative Example 2 is manufactured by the following steps:

a) preparing a $1^{st}$ aqueous solution (having 85.0 wt % water) comprising a plurality of mono-dispersed silica particles having a particle size of 250 nm with a PDI of below 0.05. The mono-dispersed silica particles are type MS2508 commercially available from Nanjing Dongjian Biological Technology Co., Ltd.

b) separately preparing a $2^{nd}$ solution comprising nanocrystalline $TiO_2$ particles with a particle size of 18-22 nm and balance water. The nanocrystalline $TiO_2$ particles are type P25 commercially available from Evonik Degussa;

c) dispersing the $1^{st}$ aqueous solution comprising the mono-dispersed silica particles obtained in step a) into the $2^{nd}$ solution obtained in step b) to form a dispersion. The dispersion comprises 10% of the mono-dispersed particles and 4.5% of the nanocrystalline $TiO_2$ particles, by weight of the dispersion; and d) filling the dispersion obtained in step c) in spray dryer type YC-015 from Shanghai Pilotech Instrument & Equipment Co., Ltd, and spray drying the dispersion with a carrier gas of nitrogen and inlet temperature of 200° C. at 0.38 MPa, thereby forming the photonic crystal microsphere of Comparative Example 2A.

Comparative Data of Examples 1A, 1B and 2 on Color Effect

A comparative experiment assessing the color effect of photonic crystal microspheres of Examples 1A and 1B and comparative Example 2 is conducted. The color effect is characterized by the color spectrum of a photonic crystal microsphere, measured according to the method for spectrum as described hereinabove. Generally, the higher the spectral peak is and the narrower the spectral width distributed, the more pure color is achieved. FIG. 1 demonstrates the spectra results of the photonic crystal microspheres of Examples 1A, 1B, and 2. Clearly the photonic crystal microspheres of Example 1A (assembled by mono-dispersed PS(core)/PMMA-PAA(shell) particles with a co-assembly material of polyacrylamide) and Example 1B (assembled by mono-dispersed PS(core)/PMMA-PAA(shell) particles with a co-assembly material of nanocrystalline $TiO_2$ particles) deliver significantly improved color effects over that of comparative Example 2 (assembled by mono-dispersed silica particles with a co-assembly material of nanocrystalline $TiO_2$ particles). In addition, Example 1A shows the highest "Relative Reflectivity" over the visible light wavelength from 450 nm to 700 nm comparing Example 1B and Example 2. This demonstrates Example 1A has the best color effect. "Relative Reflectivity" means how intensive a light in a certain range of wavelength can deliver given the same incident light. Generally, it indicates how obvious the color will show to human eyes.

Figure 2A:
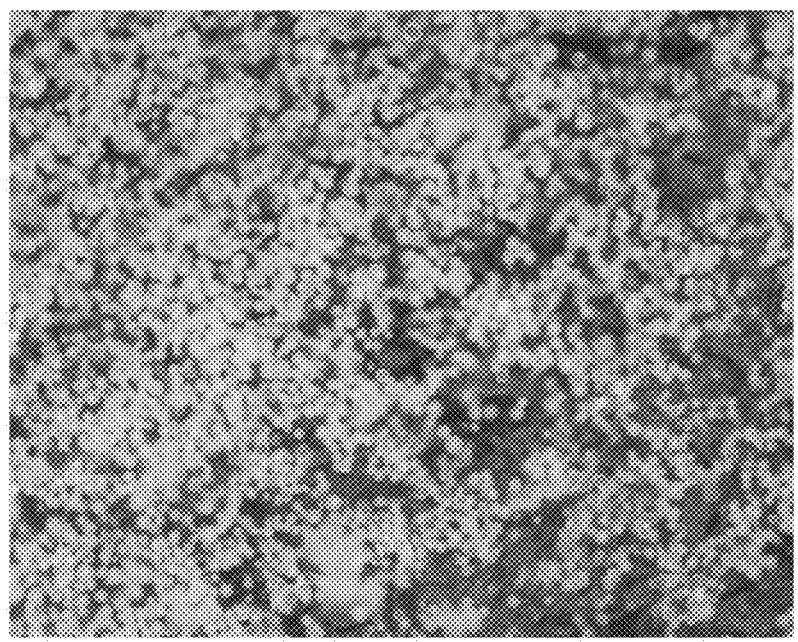
FIG. 2A is an Optical Microscopy (OM) image at a 200 magnitude, showing the visual color of the photonic crystal microsphere of Example 1A before a rub test.
Figure 2B:
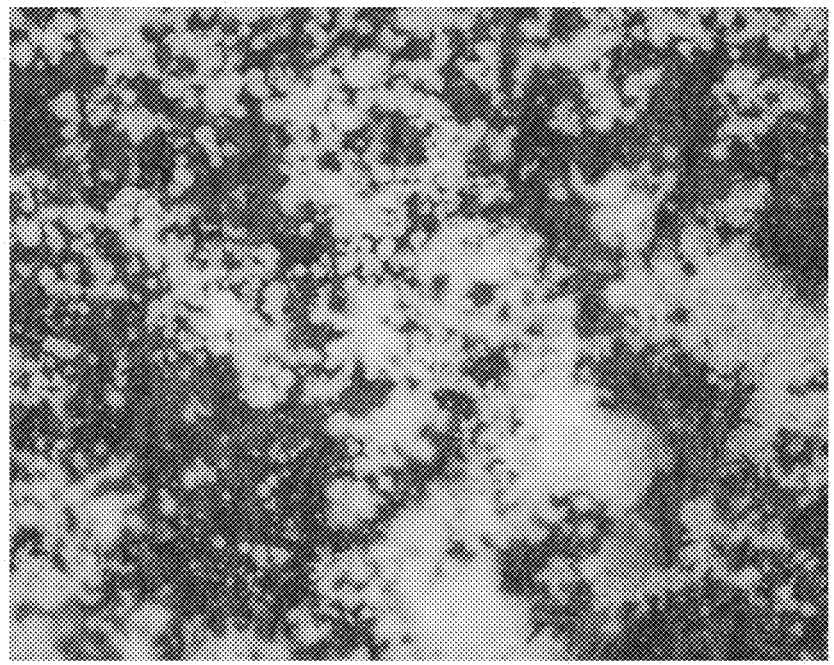
FIG. 2B is an OM image at a 200 magnitude, showing the visual color of the photonic crystal microsphere of Example 1B before a rub test.
Figure 2C:
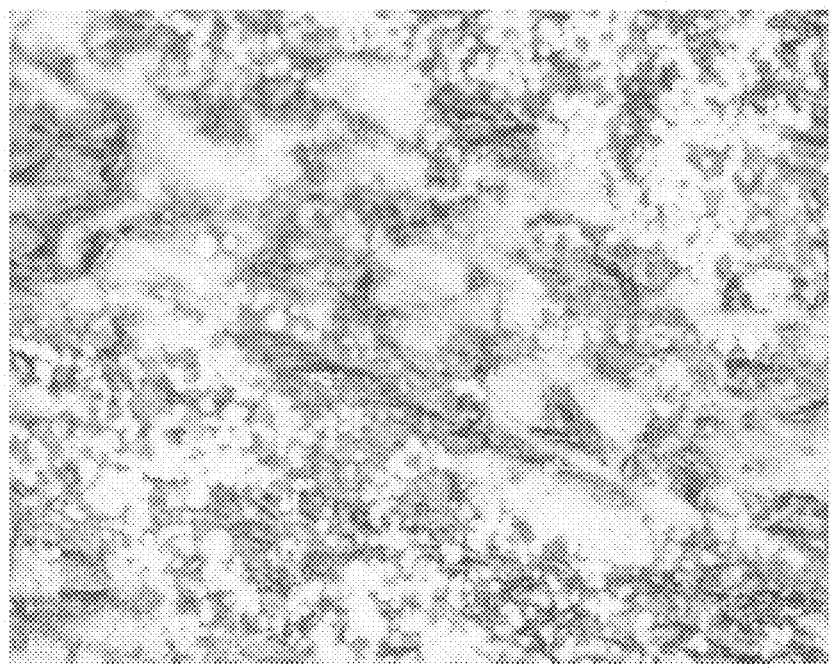
FIG. 2C is an OM image at a 200 magnitude, showing the visual color of the photonic crystal microsphere of Example 2 before a rub test.

FIGS. 2A, 2B and 2C demonstrate the visual appearance from Optical Microscopy, which shows the Example 1A has the best green color effect comparing with Example 1B and Example 2. This is consistent with FIG. 1, spectra results.

Comparative Data of Examples 1A, 1B and 2 on Mechanical Strength

Comparative experiments of assessing the mechanical strength of photonic crystal microspheres of Examples 1A and 1B and Comparative Example 2 are conducted. The mechanical strength is characterized by the structures of a photonic crystal microsphere before and after a rub test, respectively. The structures are observed via SEM. Both the SEM and rub test methods are described hereinabove. FIGS. 3A, 3B, 3C, 4A, 4B, and 4C are directed to the SEM images taken before the rub test, and FIGS. 5A, 5B, 5C, 6A, 6B and 6C are directed to the SEM images taken after the rub test. Specifically, FIGS. 3A, 4A, 5A and 6A show the relevant SEM images of the photonic crystal microsphere of Example 1A, FIGS. 3B, 4B, 5B and 6B show those of the photonic crystal microsphere of Example 1B, and FIGS. 3C, 4C, 5C and 6C show those of the photonic crystal microsphere of comparative Example 2.

Figure 3A:
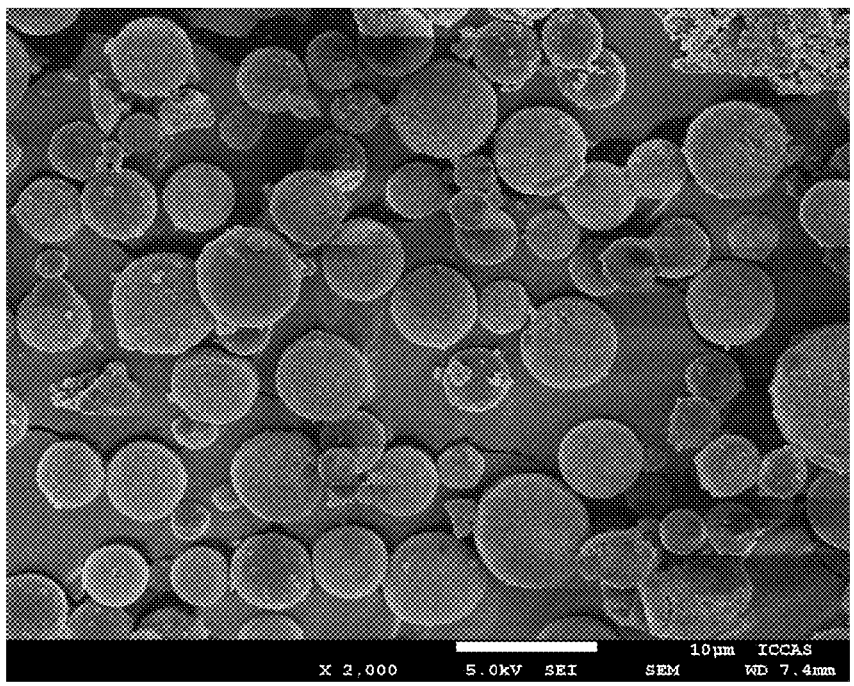
FIG. 3A is a Scanning Electron Microscope (SEM) image at a 2,000 magnitude, showing the structure of the photonic crystal microsphere of Example 1A before a rub test.
Figure 3B:
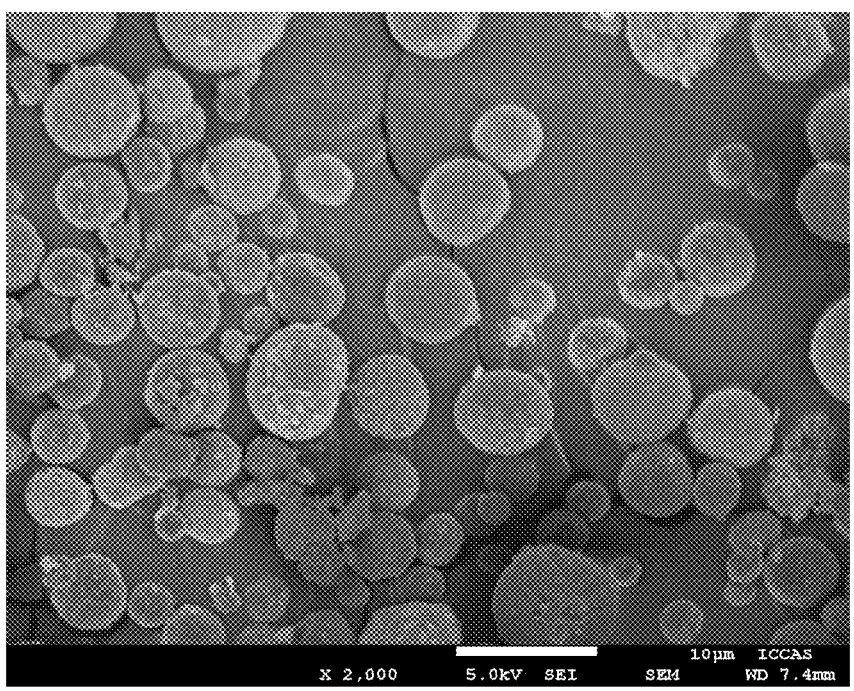
FIG. 3B is a SEM image at a 2,000 magnitude, showing the structure of the photonic crystal microsphere of Example 1B before a rub test.
Figure 3C:
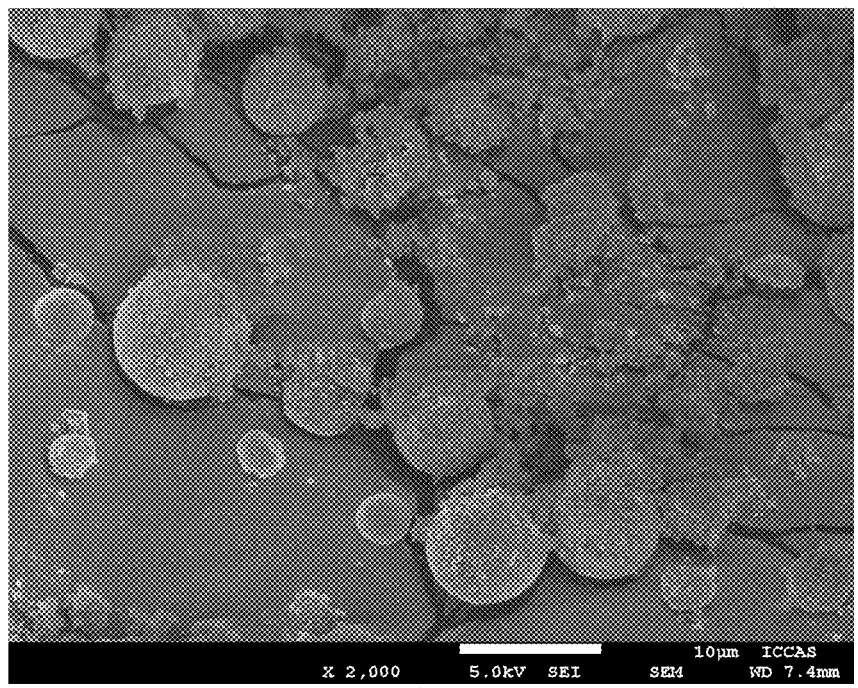
FIG. 3C is a SEM image at a 2,000 magnitude, showing the structure of the photonic crystal microsphere of Comparative Example 2 before a rub test.
Figure 4A:
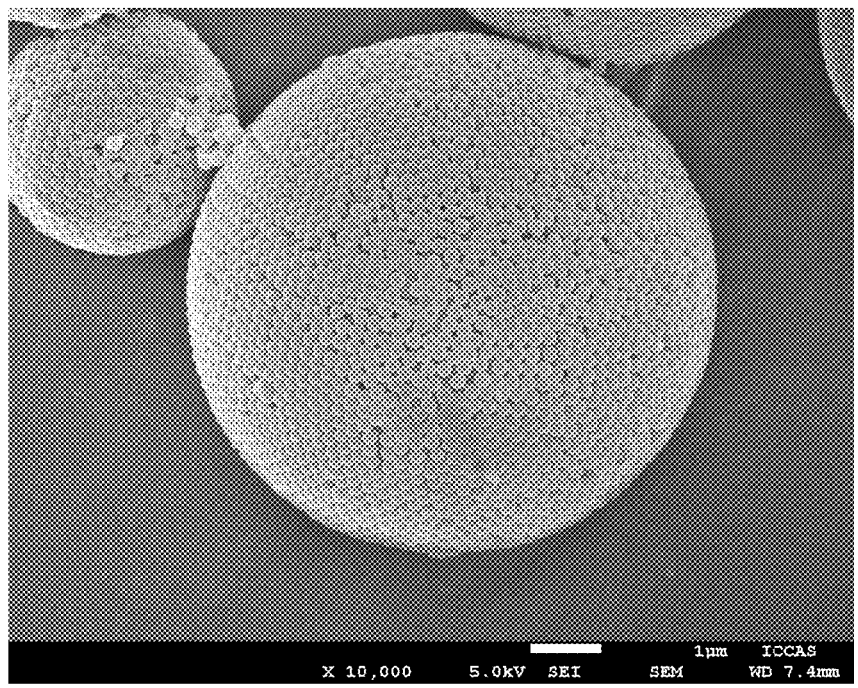
FIG. 4A is a SEM image at a 10,000 magnitude, showing the structure of the photonic crystal microsphere of Example 1A before the rub test.
Figure 4B:
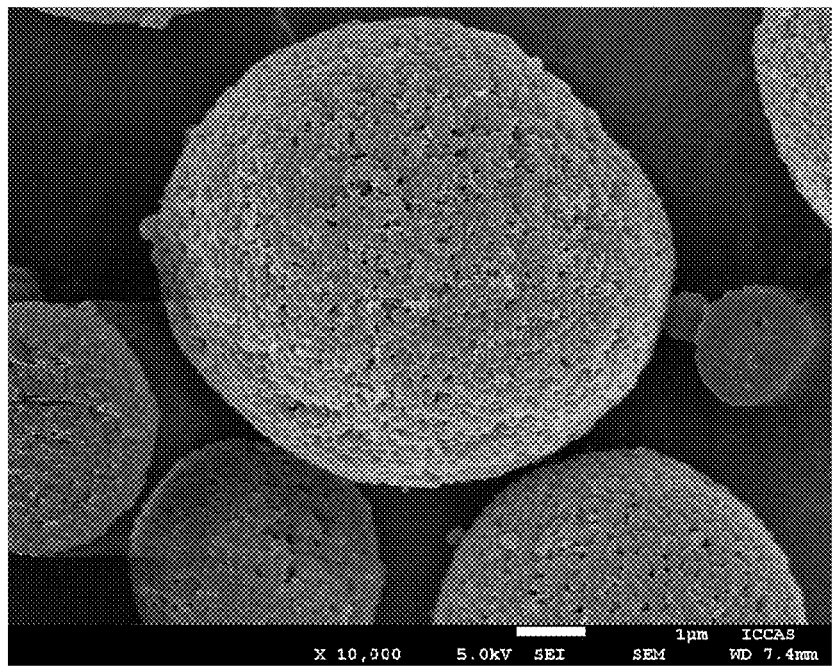
FIG. 4B is a SEM image at a 10,000 magnitude, showing the structure of the photonic crystal microsphere of Example 1B before the rub test.
Figure 4C:
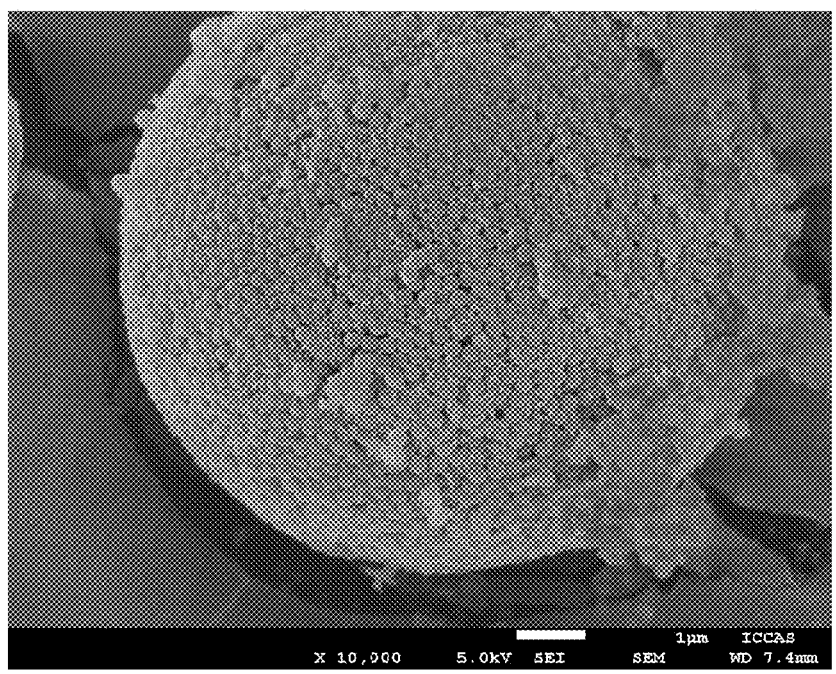
FIG. 4C is a SEM image at a 10,000 magnitude, showing the structure of the photonic crystal microsphere of Comparative Example 2 before the rub test.
Figure 5A:
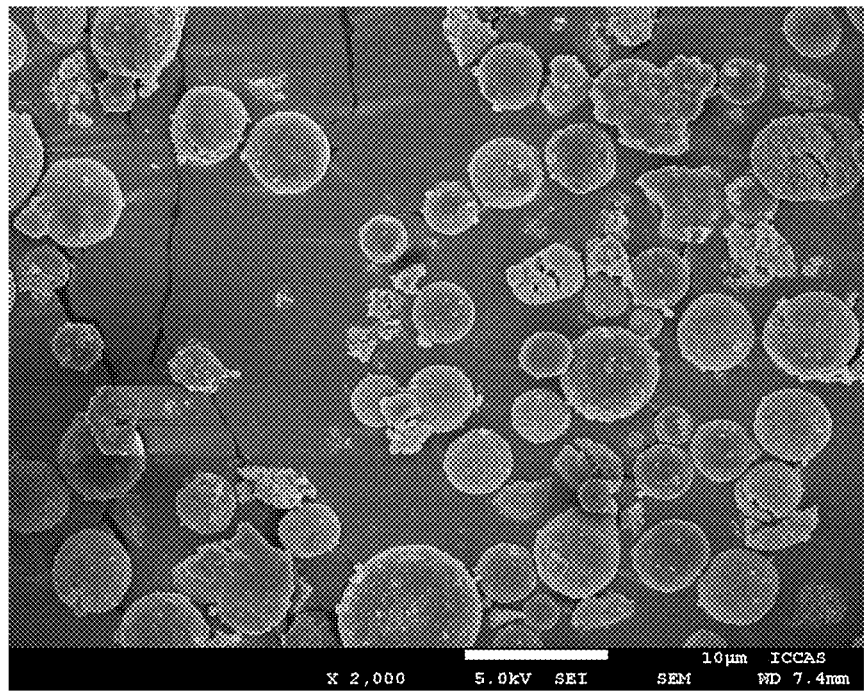
FIG. 5A is a SEM image at a 2,000 magnitude, showing the structure of the photonic crystal microsphere of Example 1A after the rub test.
Figure 5B:
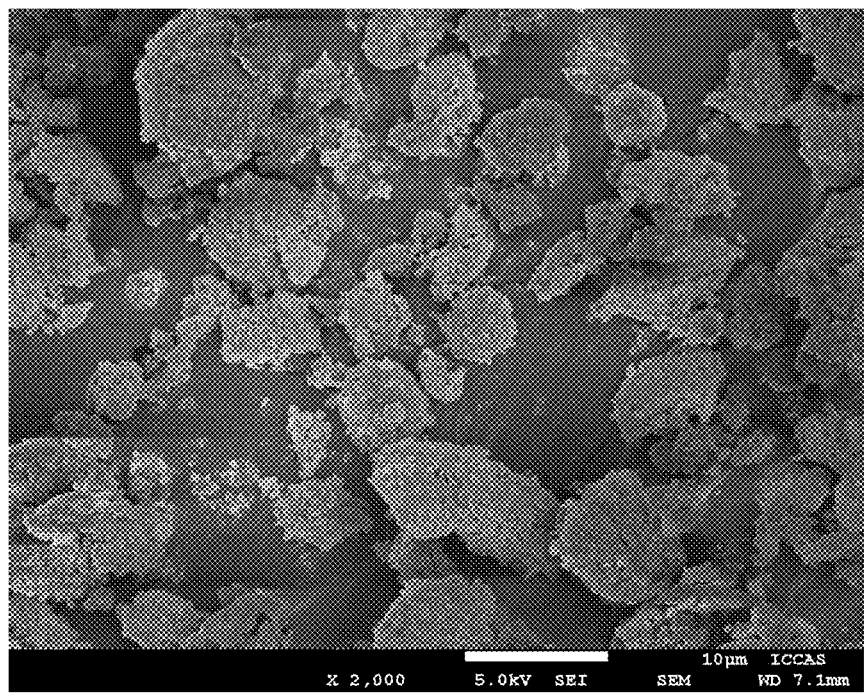
FIG. 5B is a SEM image at a 2,000 magnitude, showing the structure of the photonic crystal microsphere of Example 1B after the rub test.
Figure 5C:
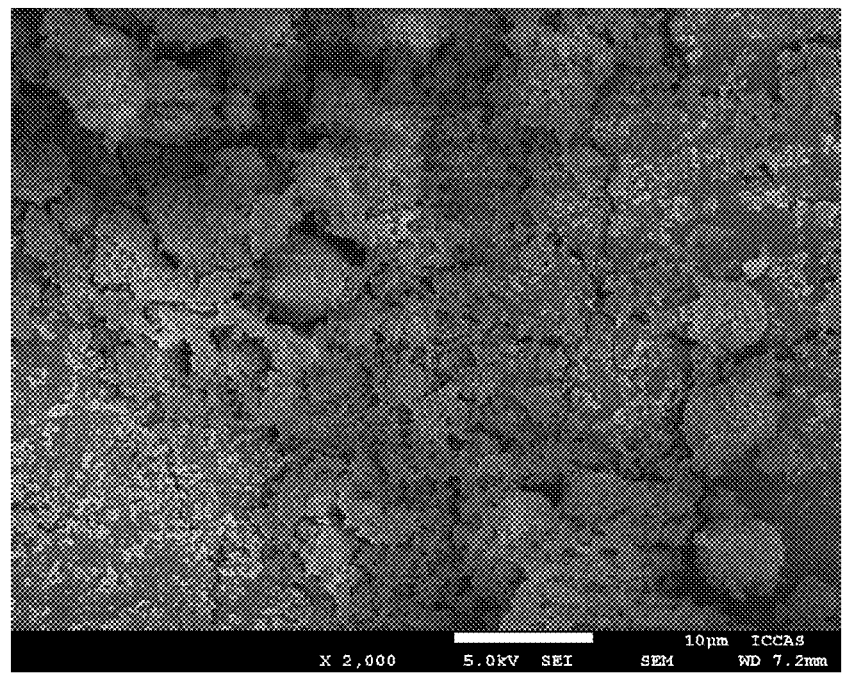
FIG. 5C is a SEM image at a 2,000 magnitude, showing the structure of the photonic crystal microsphere of Comparative Example 2 after the rub test.
Figure 6A:
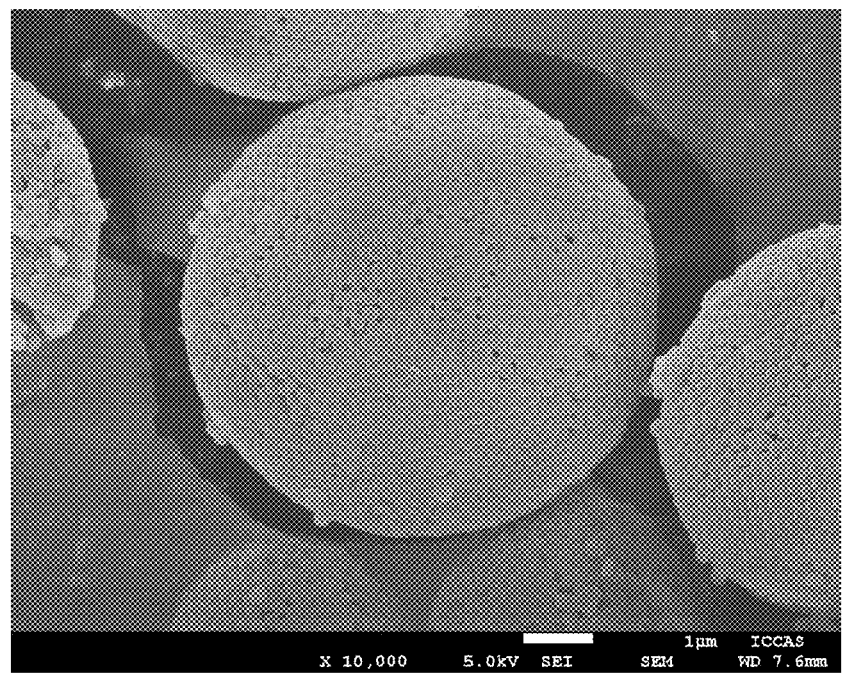
FIG. 6A is a SEM image at a 10,000 magnitude, showing the structure of the photonic crystal microsphere of Example 1A after the rub test.
Figure 6B:
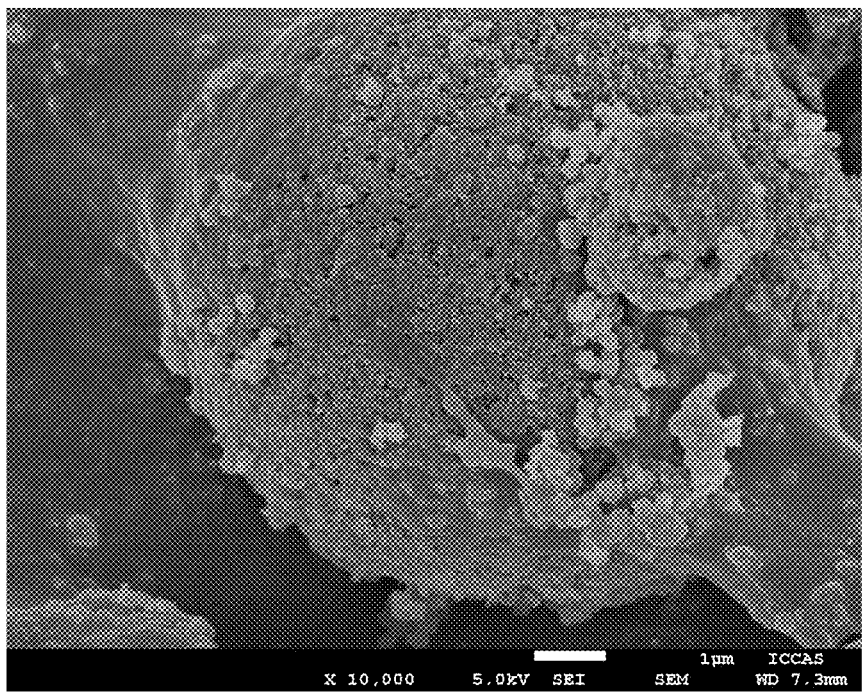
FIG. 6B is a SEM image at a 10,000 magnitude, showing the structure of the photonic crystal microsphere of Example 1B after the rub test.
Figure 6C:
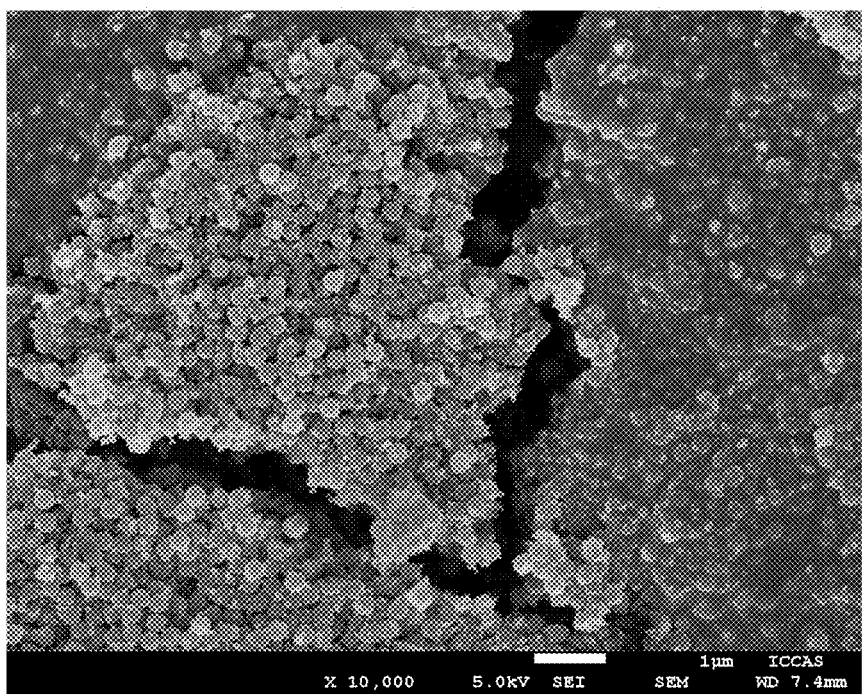
FIG. 6C is a SEM image at a 10,000 magnitude, showing the structure of the photonic crystal microsphere of Comparative Example 2 after the rub test.

As shown in FIGS. 3A, 3B, and 3C, the photonic crystal microspheres according to the present invention (Examples 1A and 1B) provide significantly higher assembly yields than the comparative example (Example 2). Also, the photonic crystal microspheres according to the present invention are of more periodic structures than the comparative example, as shown in FIGS. 4A, 4B, and 4C. In particular, the photonic crystal microsphere of Example 1A has the most periodic structure, in which the mono-dispersed particles are very well closely-packed and regularly-ordered. More importantly, as demonstrated in FIGS. 5A, 5B, and 5C, the photonic crystal microspheres according to the present invention provide structures of significantly enhanced mechanical strength, which withstand the rub test without being significantly damaged. In particular, in FIGS. 6A, 6B, and 6C with higher magnification magnitude, the photonic crystal microsphere of Example 1A are in intact the most and thus have the best mechanical strength.

Unless otherwise indicated, all percentages, ratios, and proportions are calculated based on weight of the total composition. All temperatures are in degrees Celsius (° C.) unless otherwise indicated. All measurements made are at 25° C., unless otherwise designated. All component or composition levels are in reference to the active level of that component or composition, and are exclusive of impurities, for example, residual solvents or by-products, which may be present in commercially available sources.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A photonic crystal microsphere, comprising:
    a) a plurality of mono-dispersed polymer particles each having a particle size of 100 nm to 1500 nm in a closely-packed and regularly-ordered structure, with interstition therebetween, forming the photonic crystal microsphere having a particle size of 1 µm to 1000 µm; and
    b) a co-assembly material contained in said interstation, wherein the photonic crystal microsphere is isotropic; and wherein said monodispersed polymer particles comprise a core-shell structure with an internal core and an outer core joined thereto, wherein the core and the shell are comprised of different materials.

2. The photonic crystal microsphere according to claim 1, wherein said co-assembly material is a different material from said mono-dispersed polymer particles.

3. The photonic crystal microsphere according to claim 1, wherein said co-assembly material is selected from the group consisting of a polymer, a nanocrystalline particle, and a combination thereof.

4. The photonic crystal microsphere according to claim 3, wherein said co-assembly material is a synthetic polymer selected from the group consisting of polyacrylic acid, polyacrylate, polyacrylamide, polyvinyl alcohol, polyvinyl acetate, polyethylene glycol, polypropylene glycol, polyol, polyester, polyamine, polyurethane, polyurea, polymaleic acid, polyfumaric acid, polyitaconic acid, derivatives thereof, salts thereof, and a combination thereof.

5. The photonic crystal microsphere according to claim 3, wherein said co-assembly material is a nanocrystalline particle with a particle size of about 1 nm to 28 nm, selected from the group consisting of a nanocrystalline silica particle, a nanocrystalline titanium dioxide particle, a nanocrystalline zirconia particle, a nanocrystalline alumina particle, a nanocrystalline zinc oxide particle, a nanocrystalline zinc sulfide particle, a cadmium sulfide quantum dot, a cadmium selenide quantum dot, a cadmium telluride quantum dot, a nanocrystalline silver particle, a nanocrystalline gold particle, and a combination thereof.

6. The photonic crystal microsphere according to claim 1, wherein said mono-dispersed particles have a particle size of 150 nm to 1000 nm with a polydispersity index (PDI) of below 0.5.

7. A photonic crystal pigment, comprising one or more of the photonic crystal microspheres according to claim 1.

8. The photonic crystal microsphere according to claim 1, wherein the internal core is made from polystyrene or derivatives thereof, and the outer core is made from a material selected from the group consisting of polymethyl methacrylate, polyacrylic acid, and combinations thereof.

9. The photonic crystal microsphere according to claim 3, wherein said co-assembly material is a polymer, and said polymer is not water-soluble.

10. The photonic crystal microsphere according to claim 1, wherein the photonic crystal microsphere has a particle size of greater than 100 µm.

11. The photonic crystal microsphere according to claim 3, wherein said co-assembly material is a polymer, and said polymer is polyacrylamide.

* * * * *